(12) United States Patent
Goto

(10) Patent No.: US 6,231,717 B1
(45) Date of Patent: May 15, 2001

(54) PLASTIC MOLDING UNSEALING APPARATUS

(75) Inventor: Hideo Goto, Tokyo (JP)

(73) Assignee: Nippon Scientific Co., Ltd., Tokyo (JP)

( * ) Notice: Subject to any disclaimer, the term of this patent is extended or adjusted under 35 U.S.C. 154(b) by 0 days.

(21) Appl. No.: 09/316,773

(22) Filed: May 21, 1999

(30) Foreign Application Priority Data

May 26, 1998 (JP) .................................................. 10-144485

(51) Int. Cl.[7] .................................................. H05H 1/00
(52) U.S. Cl. .................................................. 156/345
(58) Field of Search .............................. 156/345; 118/715, 118/724, 726

(56) References Cited

U.S. PATENT DOCUMENTS

| | | | |
|---|---|---|---|
| 4,822,441 | * 4/1989 | Ohta et al. .............................. | 156/345 |
| 4,826,556 | * 5/1989 | Kobayashi et al. .................... | 156/345 |
| 5,620,524 | * 4/1997 | Fan et al. .............................. | 118/715 |
| 5,766,496 | * 6/1998 | Martin .................................... | 216/56 |
| 5,855,727 | * 1/1999 | Martin et al. .......................... | 156/345 |
| 5,876,503 | * 3/1999 | Roeder et al. ......................... | 118/715 |

FOREIGN PATENT DOCUMENTS

| | | | | |
|---|---|---|---|---|
| 0123456 A2 | * 1/2000 | (EP) | ..................................... | 100/100 |
| 62-188326 | 8/1987 | (JP) | ............................... | H01L/21/56 |
| 4311043 | 11/1992 | (JP) | ............................... | H01L/21/56 |
| 5-63014 | 9/1993 | (JP) . | | |
| 6021130 | 1/1994 | (JP) | ............................... | H01L/21/56 |
| 7183319 | 7/1995 | (JP) | ............................... | H01L/21/56 |
| 8078456 | 3/1996 | (JP) | ............................... | H01L/21/56 |

* cited by examiner

*Primary Examiner*—Gregory Mills
*Assistant Examiner*—P. Hassanzadeh
(74) *Attorney, Agent, or Firm*—Howard & Howard

(57) ABSTRACT

A plastic molding unsealing apparatus includes: a first chemical liquid feeding device to take out each desired chemical liquid with a desired amount from chemical liquid bottles of at least two kinds; a liquid receiving container to temporarily receive the chemical liquid taken out by the first chemical liquid feeding device; a second chemical liquid feeding device to take out the chemical liquid from the liquid receiving container with predetermined amount; a heating device to heat the chemical liquid taken out by the second chemical liquid feeding device; and a chemical liquid injecting section to inject the chemical liquid heated by the heating device onto a sample which has been sealed to be molded with plastic. In the construction, a plastic portion of the sample is dissolved and unsealed to be unsealed, and the chemical liquid injecting section recovers drain liquid of the heated chemical liquid.

4 Claims, 4 Drawing Sheets

PLASTIC MOLDING UNSEALING APPARATUS

BACKGROUND OF THE INVENTION

1. Field of the Invention

The present invention relates to a plastic molding unsealing apparatus used for examination or quality check at a time of inferiority analysis by dissolving and removing a portion of a plastic molding such as a semiconductor chip, a condenser, a hybrid IC, or the like which has been sealed by plastic.

2. Description of the Related Art

Conventionally, there is known a plastic molding unsealing apparatus which dissolves and removes a portion of a plastic molded sample, such as a semiconductor chip, a condenser, a hybrid IC, or the like which has been sealed or encapsulated with plastic, by chemical liquid for exposing.

Among the conventional plastic molding unsealing apparatuses, there is conventionally one which unseals the sample using nitric acid. In the case of using nitric acid, since nitric acid does not corrode aluminum material used in an IC circuit, an excellent result is obtained.

However, in recent plastic moldings, ones which can not be dissolved by nitric acid have been rapidly increased, and concentrated sulfuric acid which has been heated at a high temperature is being used on such samples. In a plastic molding unsealing apparatus using such a heated concentrated sulfuric acid, the heated concentrated sulfuric acid is supplied to an unsealing processing portion of the plastic molding unsealing apparatus, and it is injected to a portion of the sample to be unsealed, thereby unsealing the portion.

In such a conventional art, however, since sulfuric acid is used, there is a problem that, in a case where the sulfuric acid contains water or moisture, aluminum material used in an IC circuit corrodes when the sulfuric acid contacts the IC circuit. Furthermore, another problem is that sulfuric acid itself has strong water absorbability and it absorbs moisture in the air when the sulfuric acid contacts the air in an unsealing processing.

SUMMARY OF THE INVENTION

The present invention has been achieved with such points in mind.

It therefore is an object of the present invention to provide a plastic molding unsealing apparatus which can accommodate various mold materials.

To achieve the object, according to a first aspect of the present invention, there is provided a plastic molding unsealing apparatus comprising: a first chemical liquid feeding means to take out each desired chemical liquid with a desired amount from chemical liquid bottles of at least two kinds; a liquid receiving container to temporarily receive the chemical liquid extracted from the first chemical liquid feeding means; a second chemical liquid feeding means to extract the chemical liquid, which has been received from the liquid receiving container with predetermined amount; a heating means to heat the chemical liquid extracted by the second chemical liquid feeding means; and a chemical liquid injecting section to inject the chemical liquid heated by the heating means onto a sample which has been sealed to be molded with plastic, thereby dissolving and unsealing a plastic portion of the sample to be unsealed, the chemical liquid injecting section recovering drain liquid of the heated chemical liquid.

Accordingly, the chemical liquid for dissolving the plastic molding is taken out with the predetermined amount by the first chemical liquid feeding means to be temporarily received in the liquid receiving container. At this time, in case of mixing and using the chemical liquids of two or more kinds are mixed and used, they are mixed in the liquid receiving container. The mixed chemical liquid is taken out with the predetermined amount by the second chemical liquid feeding means and heated by the heating means. The heated chemical liquid is injected onto the portion sample's of the portion to be unsealed, and the drain liquid is recovered.

According to a second aspect of the present invention, as it depends from the first aspect, there is provided a plastic molding unsealing apparatus, further comprising: pipes connected to the interior of the chemical liquid bottles, the interior of the first chemical liquid feeding means, the interior of the second liquid feeding means and the interior of the liquid receiving container, to block out the air; inert gas supplying means to supply inert gas to the pipes; and a switching valve to switch the pipes to supply the inert gas instead of the air when the chemical liquid is fed through the pipes.

Accordingly, the interior of the chemical liquid bottles and the pipes are sealed from the air when predetermined amounts of the chemical liquids are removed from the chemical liquid bottles by the first chemical liquid feeding means. Also the liquid receiving container and the pipes are sealed from the air when a predetermined amount of the chemical liquid is removed from the liquid receiving container by the second chemical liquid feeding means. Then, the inert gas is caused to flow into the liquid receiving container and the pipes instead of the air, and the chemical liquid in the pipes is completely fed into the pipes.

According to a third aspect of the present invention, as it depends from the first or the second aspect, there is provided a plastic molding unsealing apparatus, wherein the first chemical liquid feeding means is a first fixed delivery pump to feed the chemical liquid with a desired fixed mount; and wherein the second chemical liquid feeding means is a second fixed delivery pump to feed the chemical liquid with a desired fixed mount.

Accordingly, required chemical liquid is taken out from each chemical liquid bottle in a required amount by using the first fixed delivery pump which is the first chemical liquid feeding means and is supplied to the liquid receiving container. Also, required chemical liquid is removed from the liquid receiving container in a required amount by using the second fixed delivery pump which is the second chemical liquid feeding means and is supplied to the heating means. Therefore, a desired amount of each chemical liquid can be used.

According to a fourth aspect of the present invention, as it depends from one aspect among the first aspect to the third aspect, there is provided a plastic molding unsealing apparatus wherein the first chemical liquid feeding means is configured to selectively take out each chemical liquid from a plurality of chemical liquid bottles to feed the same to the liquid receiving container.

Accordingly, when chemical liquid of a kind is used alone from a plurality of chemical liquids, the first chemical liquid feeding means takes out a predetermined amount of chemical liquid from a desired chemical liquid bottle to feed the same into the liquid receiving container. Also, when a plurality of chemical liquids are mixed and used, the first chemical liquid feeding means takes out predetermined amounts of chemical liquids from a desired plurality of chemical liquid bottles to feed the same into the liquid receiving container.

According to a fifth aspect of the present invention, as it depends from the first aspect or the second aspect, there is provided a plastic molding unsealing apparatus wherein the liquid receiving container is used for mixing chemical liquids of two or more kinds which have been fed.

Accordingly, a plurality of kinds of chemical liquids which have been fed by the first chemical liquid feeding means are mixed in the liquid receiving container. As a result, a compound chemical liquid obtained by mixing desired chemical liquids can be used in the apparatus.

According to a sixth aspect of the present invention, as it depends from the first aspect or the second aspect, there is provided a plastic molding unsealing apparatus wherein the chemical bottles include at least a nitric acid bottle and a sulfuric acid bottle.

Accordingly, the nitric acid bottle containing nitric acid and the sulfuric acid bottle containing sulfuric acid are connected to the first chemical liquid feeding means, and nitric acid and/or sulfuric acid is fed by a predetermined amount(s) into the liquid receiving container to be used. As a result, one of only nitric acid and mixture of nitric acid and sulfuric acid having a proper mixing ratio can be selected and used.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
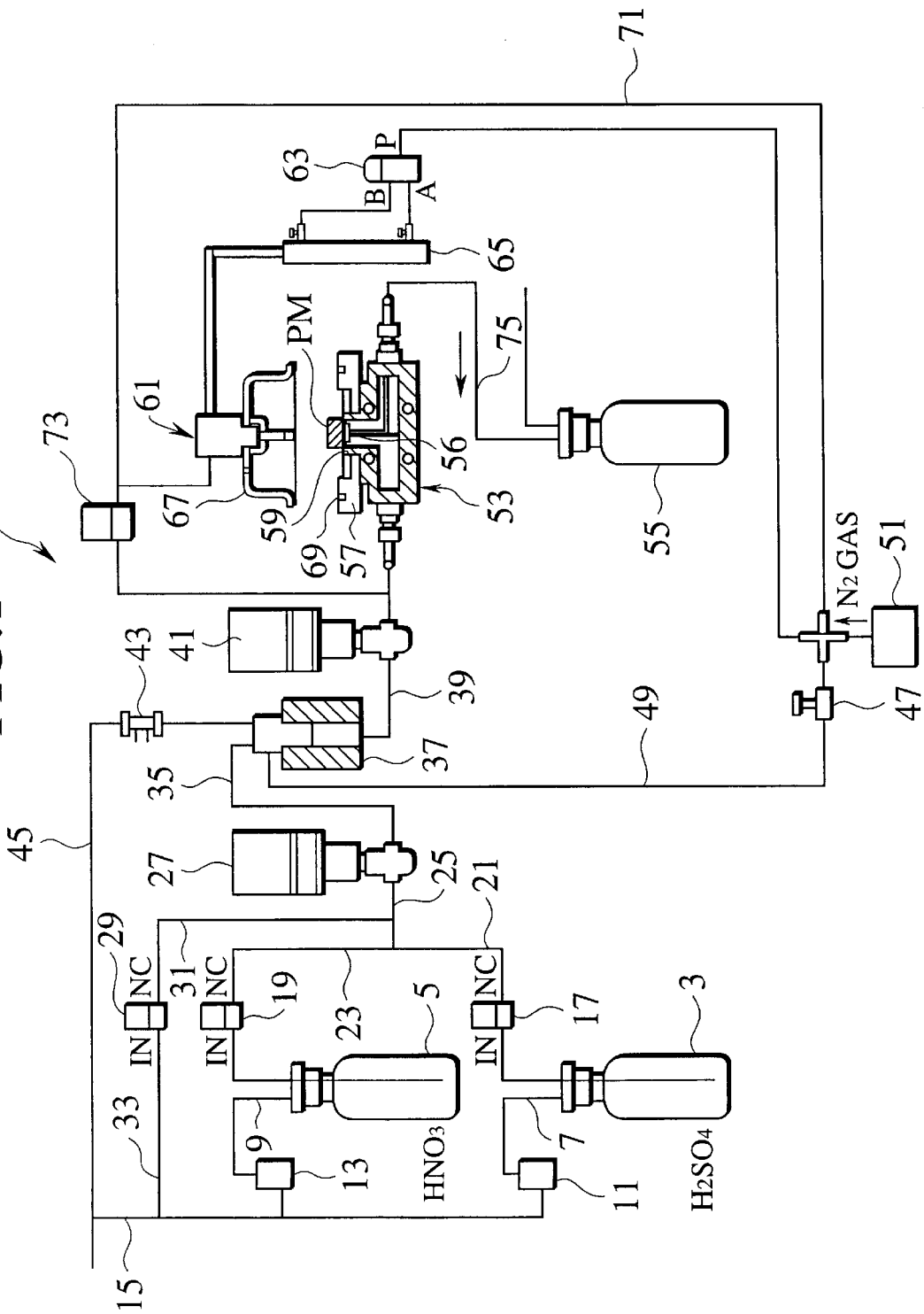
FIG. 1 is a block diagram showing a configuration of a plastic molding unsealing apparatus according to the present invention.

There will be detailed below the preferred embodiments of the present invention with reference to the accompanying drawings. Like members are designated by like reference characters.

In FIG. 1, a plastic molding unsealing apparatus 1 as a decapsulator to unseal or to decapsulate a plastic molding according to the present invention is shown. The plastic molding unsealing apparatus 1 is provided with a sulfuric acid ($H_2SO_4$) bottle 3 which is a first chemical liquid bottle and a nitric acid ($HNO_3$) bottle 5 which is a second chemical liquid bottle. Pipes 7 and 9 inserted into inlet sides of the sulfuric acid bottle 3 and the nitric acid bottle 5 are respectively connected through check valves 11 and 13 to a pipe 15 for supplying nitrogen gas ($N_2$) which is one example of an inert gases.

Outlet sides of the sulfuric acid bottle 3 and the nitric acid bottle 5 are connected to a first fixed delivery pump 27 serving as first chemical liquid feeding means via a pipe 25 by pipes 21 and 23 having electromagnetic valves 17 and 19 which are cut-off valves. The first fixed delivery pump 27 is for withdrawing a fixed amount of chemical liquid. It should be noted that the pipe 25 is connected to a pipe 33 for supplying nitrogen gas ($N_2$) via an electromagnetic valve 29 by a pipe 31.

The first fixed delivery pump 27 is connected to an inlet side of a liquid receiving container 37 by a pipe 35, and the liquid receiving container 37 temporarily stores a fixed amount of chemical liquid. An outlet side of the liquid receiving container 37 is connected to a second fixed delivery pump 41 serving as second chemical liquid feeding means by a pipe 39. Also, the liquid receiving container 37 is connected to a pipe 45 which has a liquid surface detector 43, and it is also connected to a pipe 49 having a flow rate adjusting device 47. An end of the pipe 49 is connected with nitrogen gas supplying means 51 for supplying nitrogen gas which is one example of an inert gas supplying means.

The second fixed delivery pump 41 is connected with a heat exchanger 53 which is one example of a heating means, and the heat exchanger 53 heats liquid which has been supplied by the second fixed delivery pump 41 up to a predetermined temperature. The heat exchanger 53 is connected with a drain liquid bottle 55, and the drain liquid bottle 55 recovers drain liquid where mold material of a sample PM placed on a center of the heat exchanger 53 is dissolved.

It should be noted that the heat exchanger 53 is of a type wherein a pipe or pipes are formed spirally and a tip end thereof is provide with a nozzle 56 serving as a liquid injecting portion for injecting chemical liquid is used in this embodiment, which is well known (refer to, for example, Japanese Patent Application Laid-Open No. 5-63014) and detailed description thereof is omitted.

On the heat exchanger 53 a block 57 on which the sample PM molded with plastic is placed with a face thereof to be unsealed facing downward is provided, and an aperture for injecting chemical liquid is provided at a center of the block 57.

A sample pressing-down member 61 for pressing down the sample PM is provided above the heat exchanger 53. The sample pressing-down member 61 can be raised and lowered by an air cylinder 65 operated by an electromagnetic switching valve 63.

A sample cover 67 is provided on the sample pressing down member 61 so as to prevent scattering of chemical liquid which has been injected on to the sample PM. A sealing member 69 is provided at a peripheral portion of the block 57 for sealing the inside of the sample cover 67 when the sample cover 67 is lowered. Also, a pipe 71 and an electromagnetic valve 73 are provided for supplying nitrogen gas to the inside of the heat exchanger 53. The heat exchanger 53 and the drain bottle 55 are connected to each other by a pipe 75.

Next, operation for unsealing a plastic molding will be explained with reference to FIGS. 2 to 4.

Figure 2:
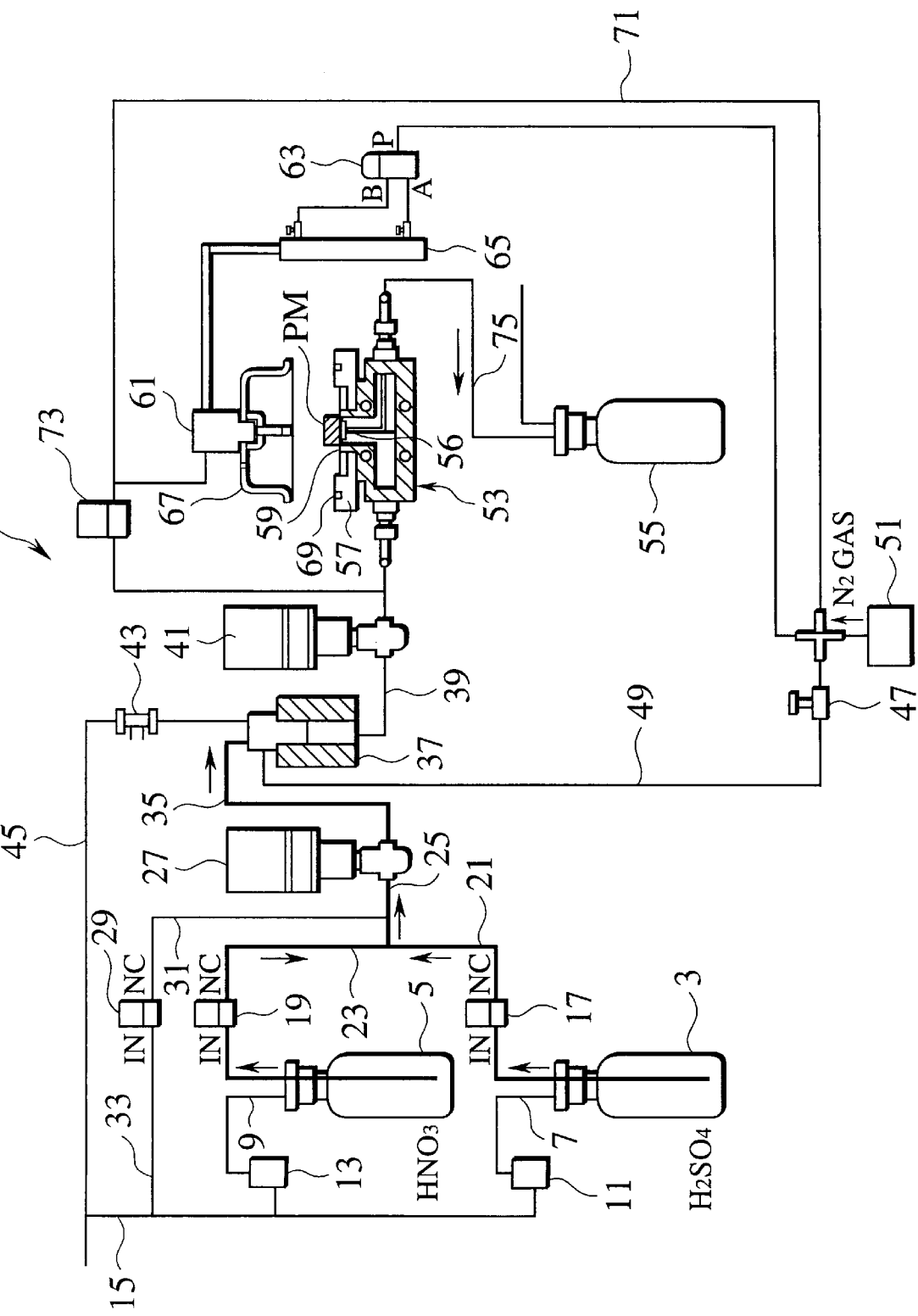
FIG. 2 is a process diagram showing a step of an unsealing process using the plastic molding unsealing apparatus shown in FIG. 1.

Referring to FIG. 2, a predetermined amount of the chemical liquid is withdrawn from only the sulfuric acid bottle 3, only nitric acid bottle 5, or both of the sulfuric acid bottle 3 and the nitric acid bottle 5 to be fed to and stored in the liquid receiving container 37. At this time, one case can be selected from a case where only the nitric acid is taken out, a case where only the sulfuric acid is taken out, and a case where the nitric acid and the sulfuric acid are mixed at a predetermined ratio to be taken out.

As described above, in a case where a plastic molding is unsealed with only nitric acid, aluminum material used in an IC circuit is not corroded, which results in an excellent unsealing. However, cases where dissolution can not be effected with only nitric acid due to materials used in the molds have increased recently. Also, when only sulfuric acid is used, even mold materials which can not be dissolved with only nitric acid can be dissolved, but when sulfuric acid contains water or moisture, it has the property of corroding aluminum material. For this reason, it is preferred to use a mixture of nitric acid and sulfuric acid. In this case, even mold material which can not be dissolved with only nitric acid can be dissolved in some cases, and the unsealing process becomes an intermediate result between the case of using only nitric acid and the case of using only sulfuric acid. Accordingly, the mixing ratio of nitric acid and sulfuric acid is taken in consideration and they are taken out to the liquid receiving container 37 on a case by case basis.

Figure 3:
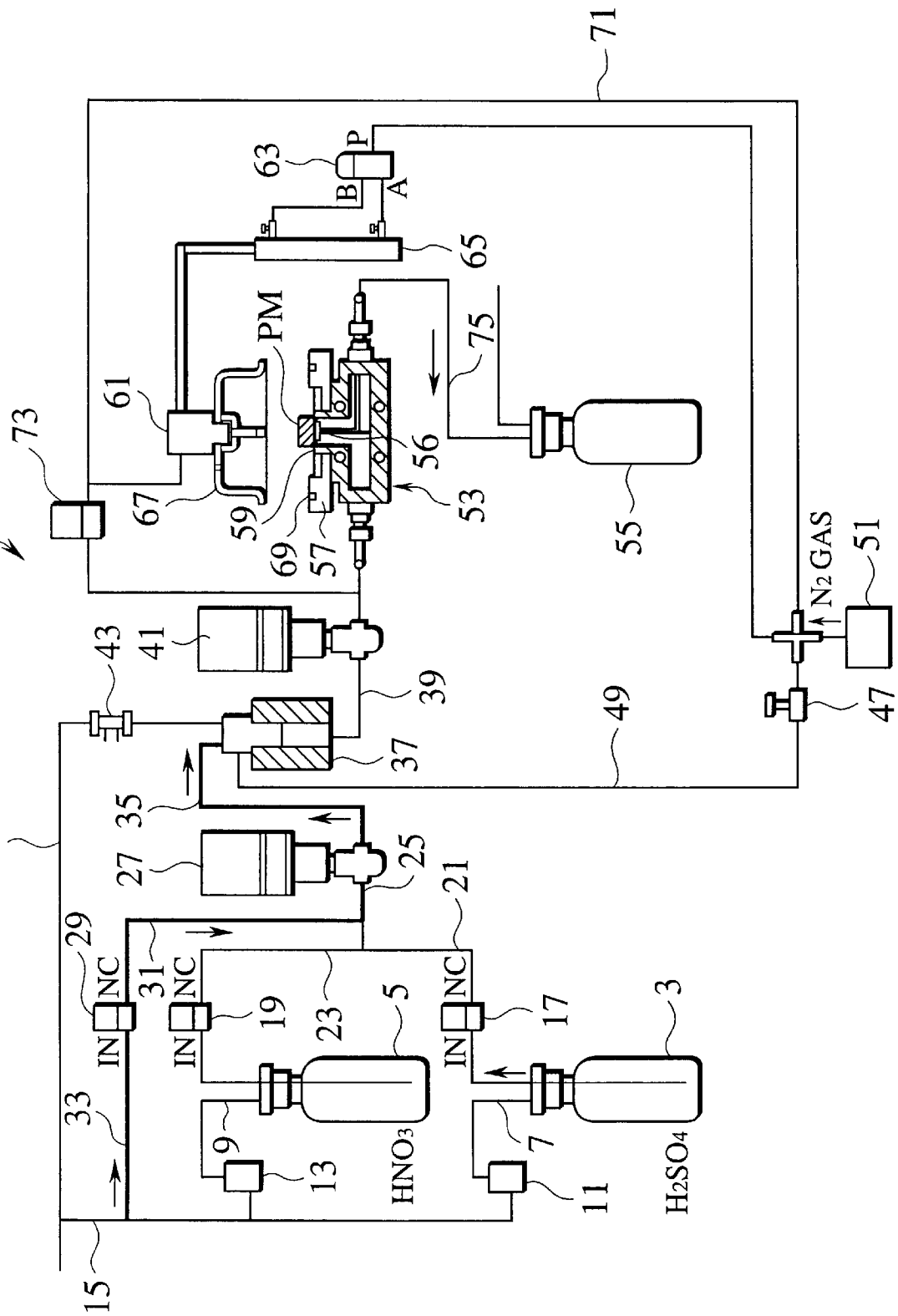
FIG. 3 is a process diagram showing a step of an unsealing process using the plastic molding unsealing apparatus shown in FIG. 1.

Referring to FIG. 3, when the feeding of chemical liquid to the liquid receiving container 37 has been completed, the electromagnetic valves 17 and 19 are closed and the electromagnetic valve 29 is opened, so that nitrogen gas is introduced into the liquid receiving container 37 from the inlet side of the first fixed delivery pump 27. Thereby, chemical liquid remaining in the interiors of the pipes 25 and 35 and the interior of the first fixed delivery pump 27 is completely expelled into the liquid receiving container 37.

Figure 4:
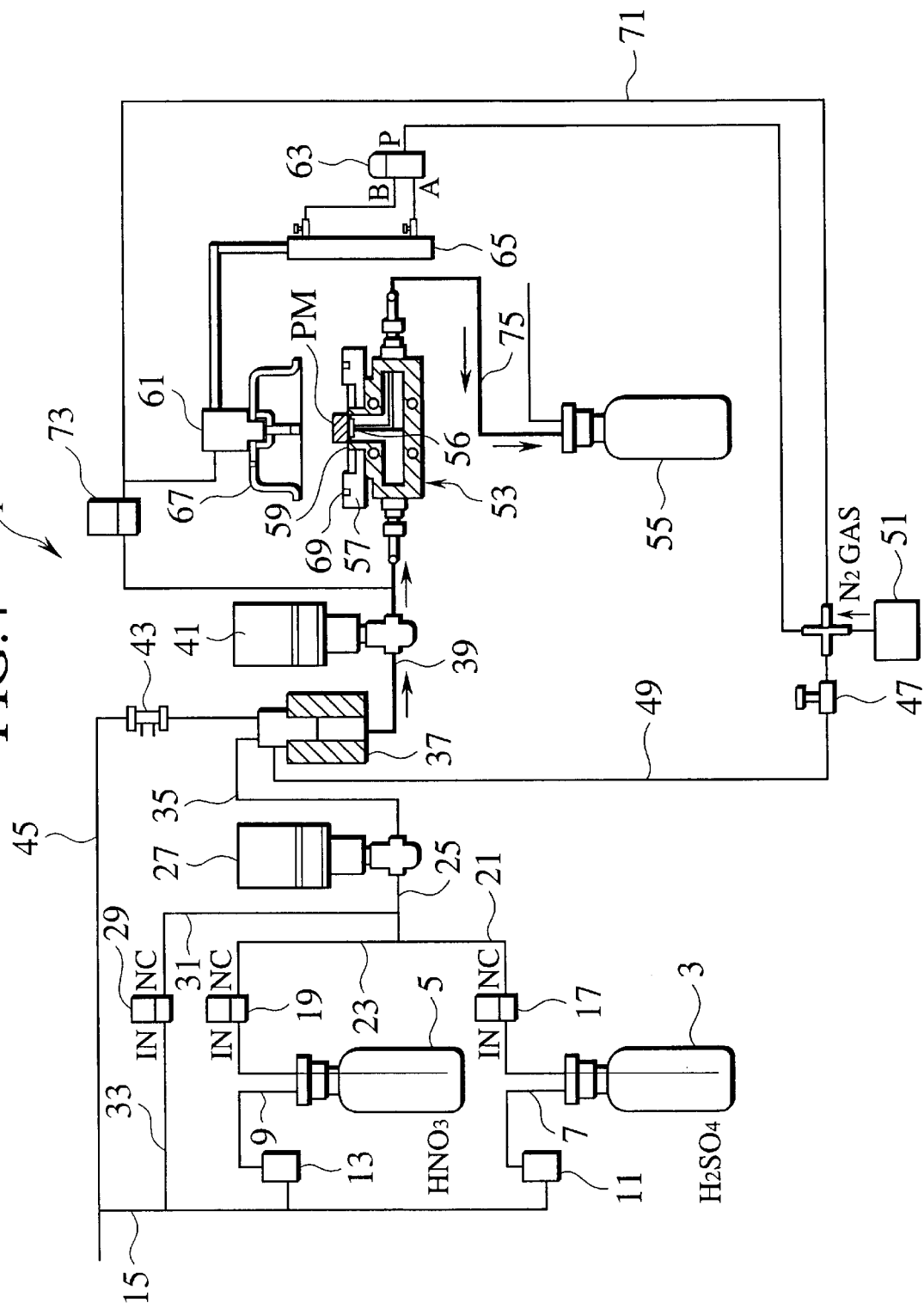
FIG. 4 is a process diagram showing a step of an unsealing process using the plastic molding unsealing apparatus shown in FIG. 1.

Referring to FIG. 4, the chemical liquid which has been stored in the liquid receiving container 37 is fed to the heat exchanger 53 by the second fixed delivery pump 41 and it is heated up to a predetermined temperature. The sample cover 67 is lowered by the air cylinder 65 from above the sample PM set on an upper surface of the block 57 with a surface thereof to be unsealed facing downward, and the sample PM is pressed down by the sample pressing-down member 61, so that the heated chemical liquid is injected from the nozzle 56 towards a lower surface of the sample PM to dissolve the plastic molding of the sample PM to unseal, to decapsulate or to open the sample PM. The drain liquid is recovered into the drain liquid bottle 55 through the pipe 75.

When the feeding of the chemical liquid to the heat exchanger 53 has been completed, the electromagnetic valve 73 is opened to supply nitrogen gas into the heat exchanger 53, thereby expelling the chemical liquid remaining in the inside of the heat exchanger 53 therefrom.

From the above results, when the plastic molding of the sample PM is dissolved, since only the nitric acid, only the sulfuric acid, or the mixture of the nitric acid and the sulfuric acid having a predetermined ratio thereof can be selected depending upon the quality of the plastic molding, a preferred unsealing process can be performed.

Also, at this time, since, after such chemical liquids as nitric acid and sulfuric acid are taken out in predetermined amounts by the first fixed delivery pump 27, they are injected on to the sample, the mixture having a predetermined ratio of nitric acid and sulfuric acid can be used so that a stable unsealing process can be performed.

Furthermore, since the interiors of the first fixed delivery pump 27 and the pipes 7, 21 and 35 are sealed from the air and are filled with nitrogen gas which is an inert gas, even when sulfuric acid having a strong moisture absorbability is used, it is prevented from contacting the air and absorbing moisture therein. Therefore, cases in which aluminum material used in an IC is corroded by using sulfuric acid, as is conventionally performed, are prevented, and various plastic molding materials can be dissolved.

The entire contents of Japanese Patent Application P10-144485 (filed May 26, 1998) are incorporated herein by reference.

Although the invention has been described above by reference to certain embodiments of the invention, the invention is not limited to the embodiments described above. Modifications and variations of the embodiments descried above will occur to those skilled in the art, in light of the above teachings. For example, in the above embodiment, nitric acid and sulfuric acid are used as the chemical liquids and nitrogen gas is used as an inert gas, but other chemical liquids can also be used. The scope of the invention is defined with reference to the following claims.

What is claimed is:

1. A plastic molding unsealing apparatus, comprising:

a plurality of reagent containers each containing a liquid reagent, said reagent containers connected to a first reagent feeding means through a plurality of pipes, said plurality of pipes connected to an inert gas source through a valve, said first reagent feeding means configured to selectively remove a predetermined amount of said reagent from one of said reagent containers;

a container connected to said first reagent feeding means by a pipe for receiving said predetermined amount of said reagent from said first reagent feeding means, said pipe connected to said inert gas source through said valve, said valve allowing said inert gas source to purge said plurality of pipes and said pipe between said container and said first reagent feeding means;

a second reagent feeding means connected to said container, said second reagent feeding means removing said predetermined amount of said reagent from said container and passing said predetermined amount of said reagent through a heat exchanger and out an injector section;

said injector section adapted to receive a sample having a plastic molding and to inject said predetermined amount of said reagent onto the plastic molding thereby dissolving and unsealing the plastic molding of the sample, said heat exchanger and said injector section connected to an inert gas source through a valve, said valve allowing said inert gas source to purge said heat exchanger and said injector section; and said injector section including a drain container, said drain container receiving said predetermined amount of said reagent after injection onto the plastic molding.

2. A plastic molding unsealing apparatus according to claim 1, wherein said first reagent feeding means comprises a first fixed delivery pump; and wherein said second reagent feeding means comprises a second fixed delivery pump.

3. A plastic molding unsealing apparatus according to claim 1, wherein said first reagent feeding means is configured to selectively remove a predetermined amount of said reagent from each of said reagent containers, said container receiving said predetermined amounts from said first reagent feeding means.

4. A plastic molding unsealing apparatus according to claim 1, wherein one of said liquid reagents comprises nitric acid and another of said liquid reagents comprises sulfuric acid.

* * * * *